US007002846B2

(12) United States Patent
Okimoto et al.

(10) Patent No.: US 7,002,846 B2
(45) Date of Patent: Feb. 21, 2006

(54) NON-VOLATILE SEMICONDUCTOR MEMORY DEVICE WITH MEMORY TRANSISTOR

(75) Inventors: Hiromi Okimoto, Hyogo (JP); Yoshikazu Miyawaki, Hyogo (JP); Satoru Kishida, Hyogo (JP); Daisuke Agawa, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/962,600

(22) Filed: Oct. 13, 2004

(65) Prior Publication Data

US 2005/0083737 A1 Apr. 21, 2005

(30) Foreign Application Priority Data

Oct. 17, 2003 (JP) ............................. 2003-358122

(51) Int. Cl.
*G11C 16/04* (2006.01)

(52) U.S. Cl. ............................. 365/185.19; 365/185.2; 365/185.22

(58) Field of Classification Search ........... 365/185.19, 365/185.2, 185.22

See application file for complete search history.

(56) References Cited

U.S. PATENT DOCUMENTS 5,422,842 A 6/1995 Cernea et al.
6,807,100 B1 * 10/2004 Tanaka .................. 365/185.19

FOREIGN PATENT DOCUMENTS

| JP | 10-228784 | 8/1998 |
| JP | 10-228786 | 8/1998 |
| JP | 11-273386 | 10/1999 |
| JP | 2000-30476 | 1/2000 |
| JP | 2003-203488 | 7/2003 |

OTHER PUBLICATIONS

U.S. Appl. No. 10/660,789, filed Sep. 12, 2004, Nitta, et al., "Nonvolatile Semiconductor Memory Device".
U.S. Appl. No. 10/940,812, filed Sep. 15, 2004, Mitanl, et al., "Non-Volatile Semiconductor Memory Device Allowing Efficient Programming Operation and Erasing Operation in Short Period of Time".

* cited by examiner

*Primary Examiner*—Huan Hoang
(74) *Attorney, Agent, or Firm*—McDermott Will & Emery LLP

(57) ABSTRACT

In the present flash memory a threshold voltage of a memory transistor to which data is written is detected and the detected value is used to set an initial value of a pulse voltage of a write pulse signal, and whenever the write pulse signal is applied, the pulse voltage is increased by a step voltage. The memory transistor's drain current and the threshold voltage's variation can be smaller than when a fixed pulse voltage is applied, as conventional.

7 Claims, 18 Drawing Sheets

FIG.2A  READ
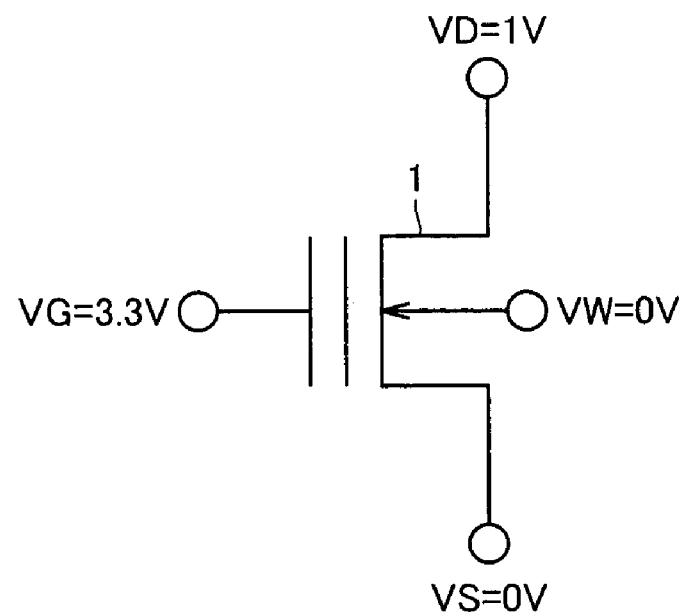
FIG.2B
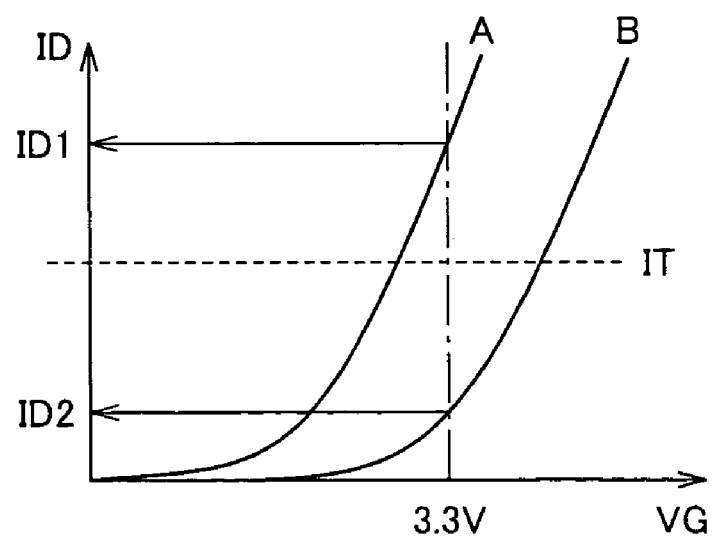

FIG.3A WRITE
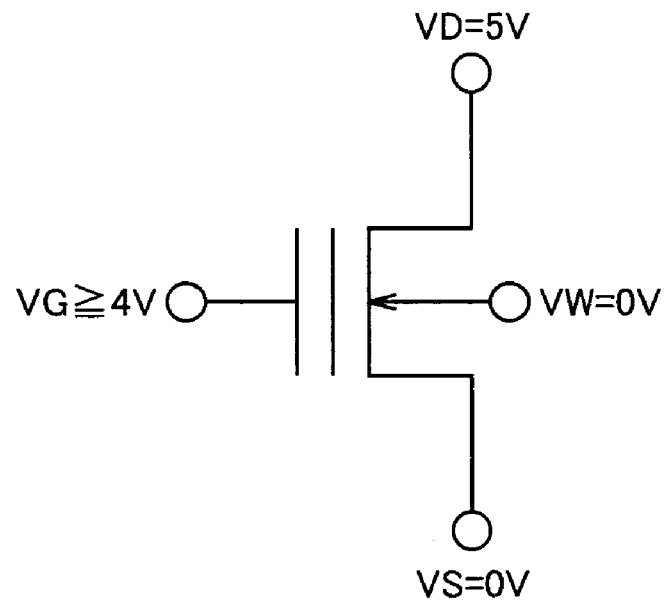
FIG.3B
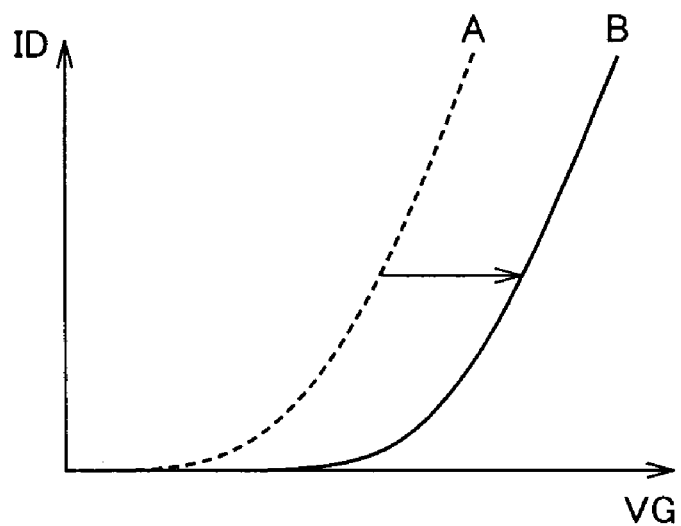

FIG.4A ERASE
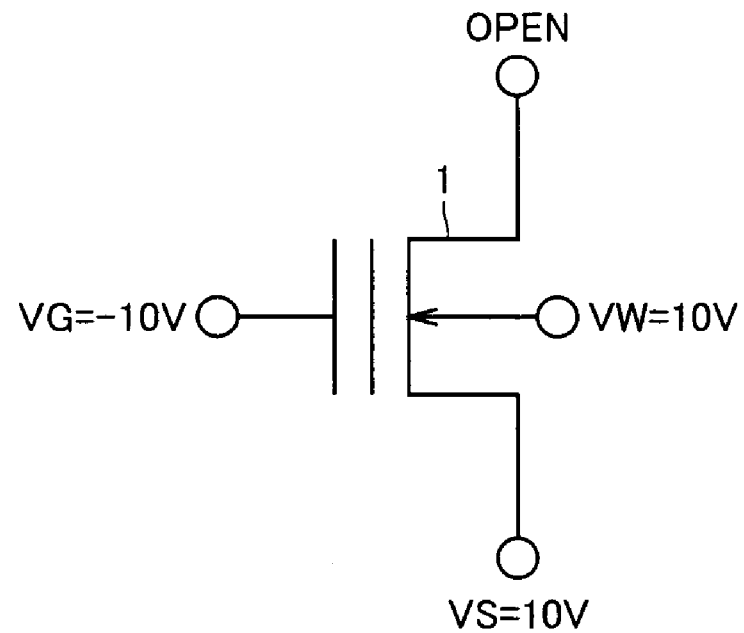
FIG.4B
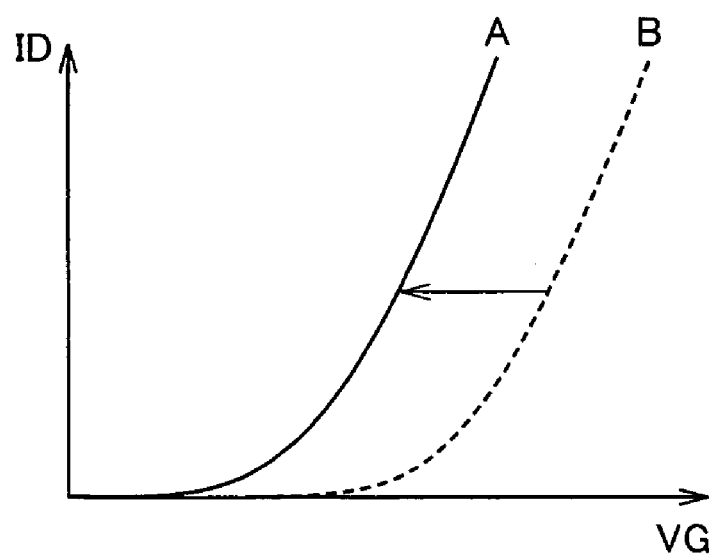

INITIAL VALUE OF PULSE VOLTAGE

VALUE OF THRESHOLD VOLTAGE DETECTED

TIME t

TIME t

NON-VOLATILE SEMICONDUCTOR MEMORY DEVICE WITH MEMORY TRANSISTOR

BACKGROUND OF THE INVENTION

1. Field of the Invention

The present invention relates generally to non-volatile semiconductor memory devices and particularly to those including a memory transistor having a floating gate.

2. Description of the Background Art

Conventionally, in flash memory, applying a fixed pulse voltage to a memory transistor at a control gate and making a decision as to whether the memory transistor's threshold voltage has reached a verify voltage are repeated to write a data signal.

There is also a method applying a fixed voltage to a memory transistor at a control gate and detecting that the memory transistor's drain current has reached a reference current, and ending a write (see U.S. Pat. No. 5,422,842 for example).

In conventional flash memory, however, when a memory transistor's control gate receives voltage the memory transistor has a large initial current flowing therethrough and the flash memory disadvantageously consumes a large current. Furthermore, the memory transistor's threshold voltage is excessively increased and threshold voltage's variation is disadvantageously increased.

SUMMARY OF THE INVENTION

The present invention mainly contemplates a non-volatile semiconductor memory device providing a small current consumption and a limited variation in threshold voltage of a memory transistor.

The present invention in one aspect provides a non-volatile semiconductor memory device including: a memory transistor having over a semiconductor substrate's well region a floating gate and a control gate deposited on the floating gate, the memory transistor having a threshold voltage set to a first voltage to store a data signal of a first logic level, the memory transistor having the threshold voltage set to a second voltage higher than the first voltage to store a data signal of a second logic level; a first detection circuit detecting the memory transistor's threshold voltage; a write circuit applying a prescribed voltage to the memory transistor between a drain and a source and applying a pulse signal train between the control gate and the well region, and increasing the memory transistor's threshold voltage from the first voltage to the second voltage; and a control circuit driven by a resultant detection provided by the first detection circuit to set an initial value of an amplitude voltage of the pulse signal train and increase the pulse signal train's amplitude voltage at a prescribed rate.

The present invention in another aspect provides a non-volatile semiconductor memory device including: a memory transistor having over a semiconductor substrate's well region a floating gate and a control gate deposited on the floating gate, the memory transistor having a threshold voltage set to a first voltage to store a data signal of a first logic level, the memory transistor having the threshold voltage set to a second voltage higher than the first voltage to store a data signal of a second logic level; a write circuit applying a prescribed voltage to the memory transistor between a drain and a source and applying a pulse signal train between the control gate and the well region, and increasing the memory transistor's threshold voltage from the first voltage to the second voltage; a detection circuit detecting a value of a current of the memory transistor; and a control circuit setting an initial value of the pulse signal train to a predetermined value and driven by a resultant detection provided by the detection circuit to set a rate applied to increase the pulse signal train's amplitude voltage, and employing the rate to increase the pulse signal train's amplitude voltage.

The present invention in still another aspect provides a non-volatile semiconductor memory device including: a memory transistor having over a semiconductor substrate's well region a floating gate and a control gate deposited on the floating gate, the memory transistor having a threshold voltage set to a first voltage to store a data signal of a first logic level, the memory transistor having the threshold voltage set to a second voltage higher than the first voltage to store a data signal of a second logic level; a write circuit applying a third voltage to the memory transistor between a drain and a source thereof and applying a fourth voltage between the control gate and the well region, and increasing the memory transistor's threshold voltage from the first to second voltages to write a data signal to the memory transistor; a detection circuit detecting a value of a current of the memory transistor; and a control circuit increasing the fourth voltage by a predetermined voltage stepwise and operative in response to the fourth voltage having reached a reference voltage and the detection circuit detecting the memory transistor's current value having reached a reference current to stop writing a data signal to the memory transistor.

In the present non-volatile semiconductor memory device, a memory transistor's threshold voltage is detected and the resultant detection is used to set an initial value of an amplitude voltage of a pulse signal train for writing, and the pulse signal train's amplitude voltage is also increased at a rate. As compared with applying a pulse signal train of a fixed voltage regardless of a memory transistor's threshold voltage, as conventional, the present invention can achieve a reduced current consumption and a limited variation in threshold voltage of the memory transistor.

Furthermore in the present non-volatile semiconductor memory device in another aspect a pulse signal train's initial value is set to a previously determined value and a memory transistor's current value is also detected, and the resultant detection is used to set a rate applied to increase the pulse signal train's amplitude voltage and the set rate is used to increase the pulse signal train's amplitude voltage. As compared with applying a pulse signal train of a fixed voltage regardless of a memory transistor's current value, as conventional, the present invention can achieve a reduced current consumption and a limited variation in threshold voltage of the memory transistor.

Furthermore in the present non-volatile semiconductor memory device in still another aspect a fourth voltage between a memory transistor's control gate and well region is increased by a predetermined voltage stepwise and the memory transistor's current value is detected, and when the fourth voltage attains a reference voltage and the memory transistor's current value also attains a reference current, writing a data signal to the memory transistor in response stops. As compared with applying a fixed voltage between a memory transistor's control gate and well region, as conventional, the present invention can achieve a reduced current consumption and a limited variation in threshold voltage of the memory transistor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B illustrate a method of reading data in the memory transistor shown in FIG. 1.

FIGS. 3A and 3B illustrate a method of writing data to the memory transistor shown in FIG. 1.

FIGS. 4A and 4B illustrate a method of erasing data in the memory transistor shown in FIG. 1.

DESCRIPTION OF THE PREFERRED EMBODIMENTS

First Embodiment

Figure 1:
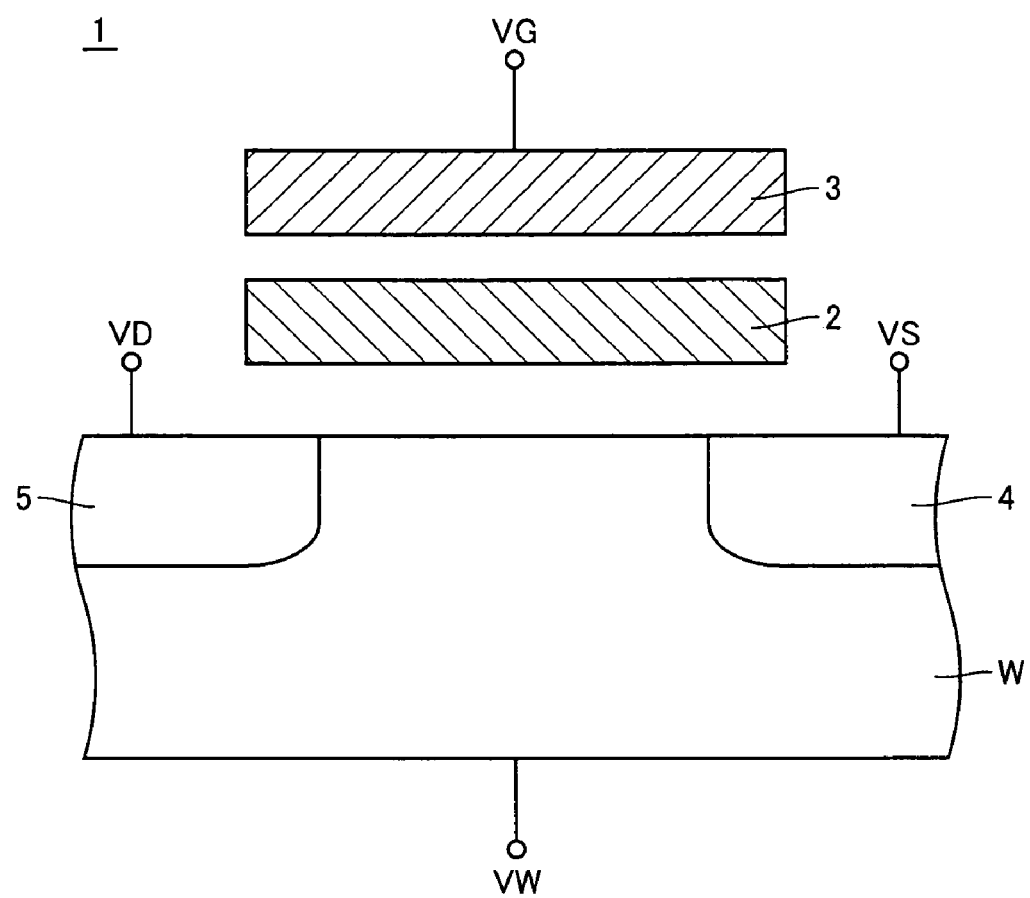
FIG. 1 is a cross section of a configuration of a memory transistor of a flash memory in accordance with a first embodiment of the present invention.

FIG. 1 is a cross section of a configuration of a memory transistor 1 of a flash memory in accordance with a first embodiment of the present invention. In FIG. 1, this memory transistor 1 includes a floating gate 2 formed above a surface of a well W at a semiconductor substrate with an insulating layer interposed, a control gate 3 formed thereabove with an insulating layer interposed, and a source 4 and a drain 5 formed on the well W surface on the opposite sides of gates 2, 3, respectively. Prescribed voltages VW, VG, VS, VD are applied to well W, control gate 3, source 4, and drain 5, respectively. Threshold voltage VT of memory transistor 1 varies depending on the number of electrons in floating gate 2.

In a reading operation, as shown in FIG. 2A, 1V is applied to drain 5 of memory transistor 1, 3.3V is applied to control gate 3, and 0V is applied to source 4 and well W, so that it is determined whether a current ID between drain 5 and source 4 exceeds a prescribed current IT, as shown in FIG. 2B. If data "0" has been written in memory transistor 1, ID<IT, and if not, ID>IT.

In a writing operation, as shown in FIG. 3A, 5V is applied to drain 5 of memory transistor 1, a voltage approximately of 4V to 9V to control gate 3, and 0V to source 4 and well W. As a result, because of the tunnel effect, electrons are injected from source 4 and well W to floating gate 2, so that a threshold voltage VT of memory transistor 1 is increased. As shown in FIG. 3B, the VG-ID characteristic of memory transistor 1 changes from curve A to curve B. In other words, the storage data in memory transistor 1 is rewritten from "1" to "0". Data write is performed at a plurality of different times until memory transistor 1 has threshold voltage VT attaining approximately 5V. How the data is written will be described later more specifically.

In an erasing operation, as shown in FIG. 4A, drain 5 of memory transistor 1 is opened (in the floating state), −10V is applied to control gate 3, and 10V is applied to source 4 and well W. Therefore, because of the tunnel effect, electrons are removed from floating gate 2 to well W, so that threshold voltage VT of memory transistor 1 is decreased. As shown in FIG. 4B, the VG-ID characteristic of memory transistor 1 changes from curve B to curve A. In other words, the storage data in memory transistor 1 is rewritten from "0" to "1". The data erasing is performed at a plurality of different times until memory transistor 1 has threshold voltage VT attaining approximately 1V.

In write verify operation, memory transistor 1 receives 1V at drain 5, receives at control gate 3 a voltage (for example of 4.5V) slightly smaller than threshold voltage VT as targeted, and receives 0V at source 4 and well W, and whether a prescribed current IC flows between drain 5 and source 4 is detected. A data write is divided and performed at a plurality of different times and it is stopped when current IC is detected.

In erasure verify operation, memory transistor 1 receives 1V at drain 5, receives at control gate 3 a voltage (for example of 1.5V) slightly larger than threshold voltage VT as targeted and receives 0V at source 4 and well W, and whether prescribed current IC flows between drain 5 and source 4 is detected. Data erasure is divided and performed at a plurality of different times and it is stopped when current IC is detected.

Figure 5:
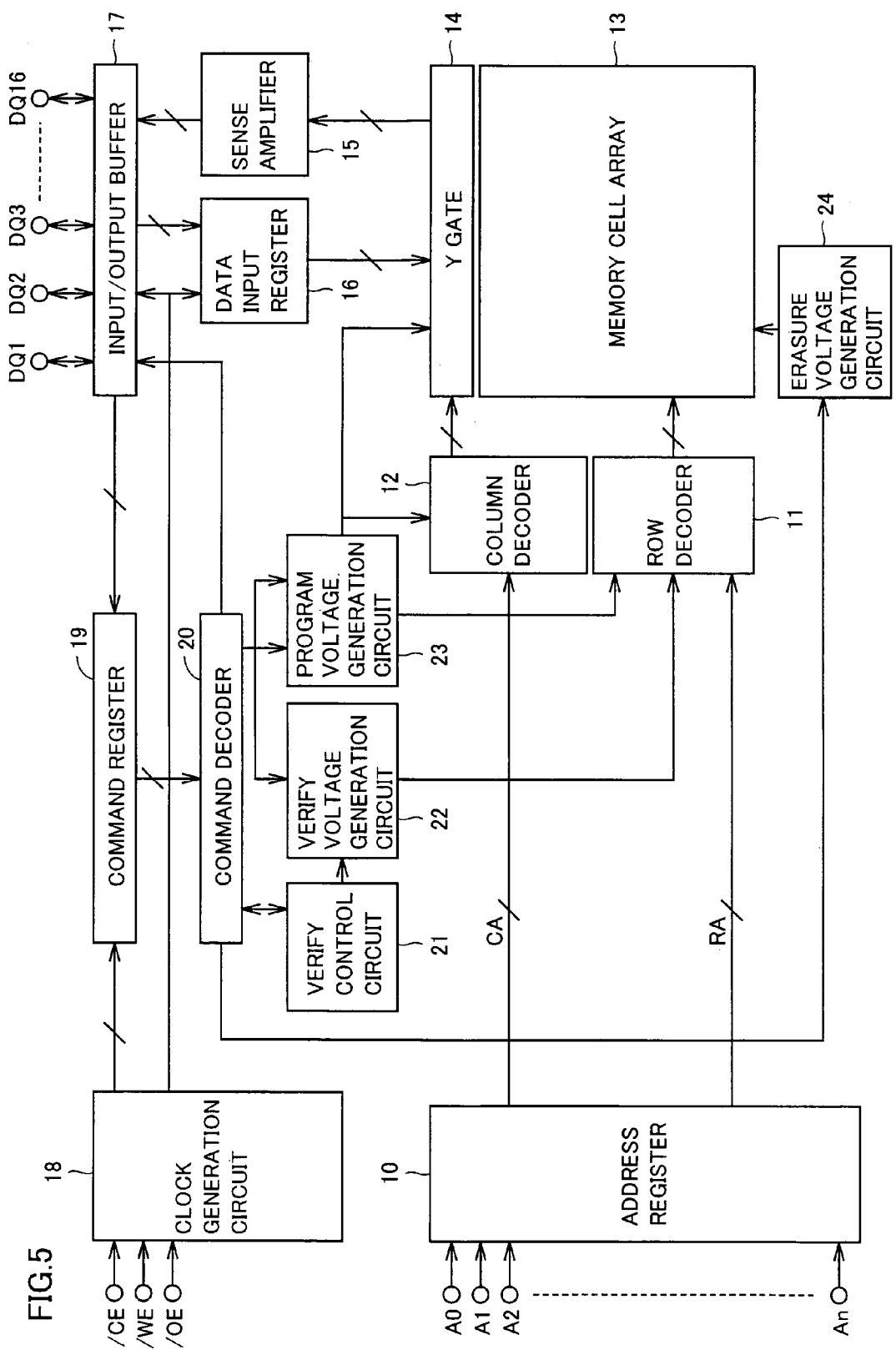
FIG. 5 is a circuit diagram generally showing a configuration of the flash memory including the memory transistor shown in FIGS. 1–4B.

FIG. 5 is a block diagram generally showing a configuration of a flash memory employing memory transistor 1 shown in FIGS. 1–4B. In FIG. 5 the flash memory includes an address register 10, a row decoder 11, column decoder 12, a memory cell array 13, a Y gate 14, a sense amplifier 15, a data input register 16 and an input/output buffer 17.

Address register 10 latches external address signals A0–An and outputs a row address signal RA and a column address signal CA, wherein n represents an integer of at least 0. Memory cell array 13 includes a plurality of memory transistors 1 arranged in rows and columns. The plurality of memory transistors 1 is previously divided in groups each formed of 16 of the memory transistors. Each group is arranged at a prescribed address designated by row and column addresses. Each memory transistor 1 stores a 1-bit data signal.

Row decoder 11 operates in response to row address signal RA output from address register 10 to designate a row address of memory cell array 13. Column decoder 12 operates in response to column address signal CA output from address register 10 to designate a column address of memory cell array 13. Y gate 14 in read operation couples the 16 memory transistors of a group designated by decoders 11 and 12 and sense amplifier 15 together and in write operation couples the 16 memory transistors of a group designated by decoders 11 and 12 and data input register 16 together.

Sense amplifier 15 in read operation reads a data signal Q of each memory transistor 1 and provides the signal to input/output buffer 17 and in verify operation detects a current of each memory transistor 1 and outputs a signal indicating a resultant detection. Data input register 16 in write operation writes data signals D1–D16 received by input/output buffer 17 to selected 16 memory transistors 1 via Y gate 14. Input/output buffer 17 in read operation externally outputs read data signals Q1–Q16 received from sense amplifier 15 and in write operation provides write data signals D1–D16 to data input register 16.

Furthermore the flash memory includes a clock generation circuit 18, a command register 19, a command decoder 20, a verify control circuit 21, a verify voltage generation circuit 22, a program voltage generation circuit 23, and an erasure voltage generation circuit 24.

Clock generation circuit 18 operates in response to external control signals /CE, /WE, /OE to generate a variety of internal control signals to generally control the flash memory. Command register 19 holds an internal control signal output from clock generation circuit 18 and a command signal received via input/output buffer 17 and provides the signals to command decoder 20. Command decoder 20 operates in response to the signals received from command register 19 to control verify control circuit 21, verify voltage generation circuit 22, program voltage generation circuit 23, erasure voltage generation circuit 24 and input/output buffer 17.

Verify control circuit 21 controls verify voltage generation circuit 22 and the like to perform a verify operation. Verify voltage generation circuit 22 generates and provides a verify voltage to row decoder 11. Program voltage generation circuit 23 generates and provides a program voltage (a write voltage) to row decoder 11, column decoder 12 and Y gate 14. Erasure voltage generation circuit 24 generates and provides an erasure voltage to memory cell array 13.

Figure 6:
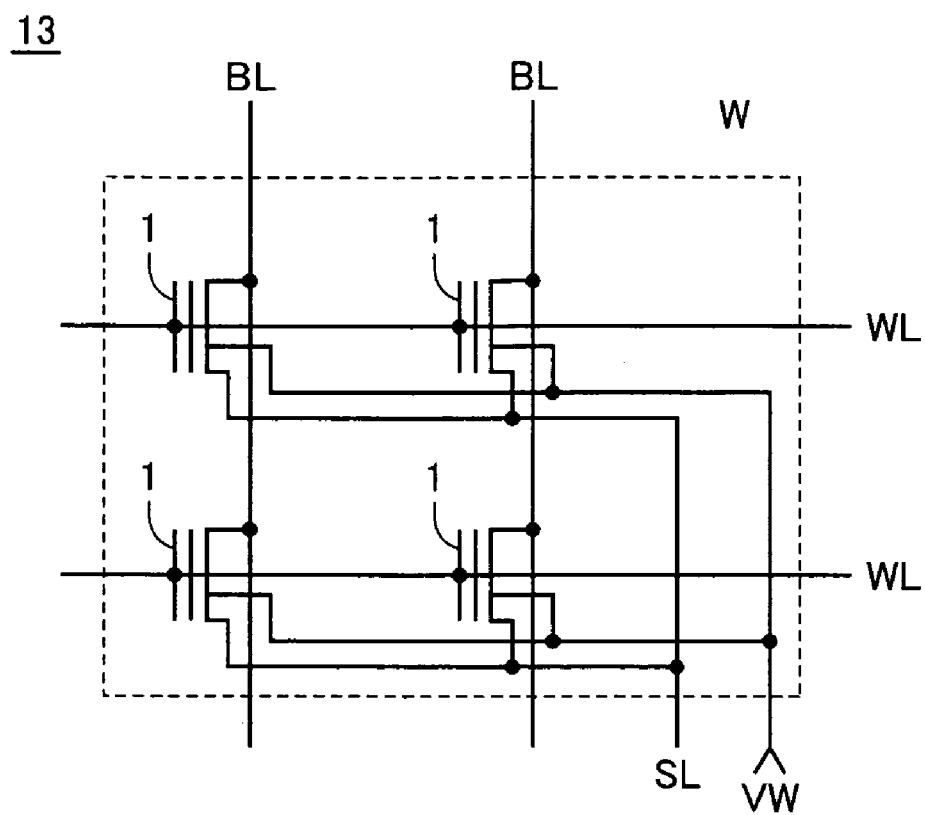
FIG. 6 is a circuit diagram showing a configuration of the memory cell array shown in FIG. 5.

FIG. 6 is a circuit diagram showing a configuration of a portion of memory cell array 13 that corresponds to a single data signal DQ. In reality, a plurality of memory transistors 1 are provided. To simplify the figure and the description, however, FIG. 6 shows memory transistors 1 in two rows and two columns. Four memory transistors 1 are arranged on a surface of well W. A word line WL is provided to correspond to each row and a bit line BL is provided to correspond to each column, and a source line SL is shared by four memory transistors 1. Each memory transistor 1 has control gate 3 connected to a corresponding word line WL, a drain 25 connected to a corresponding bit line BL, and a source to source line SL. Each word line WL is connected to row decoder 11. Each bit line BL is connected to Y gate 14. Each source line SL and well W are connected to erasure voltage generation circuit 24.

In read operation, row decoder 11 selects a single word line WL and the selected word line WL receives 3.3V. Source line SL and well W are both set to 0V and bit line BL selected by column decoder 12 is connected via Y gate 14 to sense amplifier 15. Sense amplifier 15 applies 1V to the selected bit line BL to detect whether selected memory transistor 1 has flowing therethrough current ID larger or smaller than threshold current IT, and sense amplifier 15 outputs data signal Q of a logic level corresponding to the detection. Data signal Q is externally output through input/output buffer 17.

In write operation, row decoder 11 selects a single word line WL and the selected word line WL receives a write pulse signal described later. Source line SL and well W are both set to 0V and bit line BL selected by column decoder 12 is connected via Y gate 14 to data input register 16. A write data signal D is provided via input/output buffer 17 to data input register 16. For write data signal D of "1" data input register 16 applies 0V to the selected bit line BL and thus does not rewrite data and for write data signal D of "0" applies 5V to the selected bit line BL to rewrite data. In erasure operation, each word line WL receives −10V, source line SL and well W are both set to 10V and each bit line BL is opened. Thus data is erased by the unit of a single well W.

Figure 7:
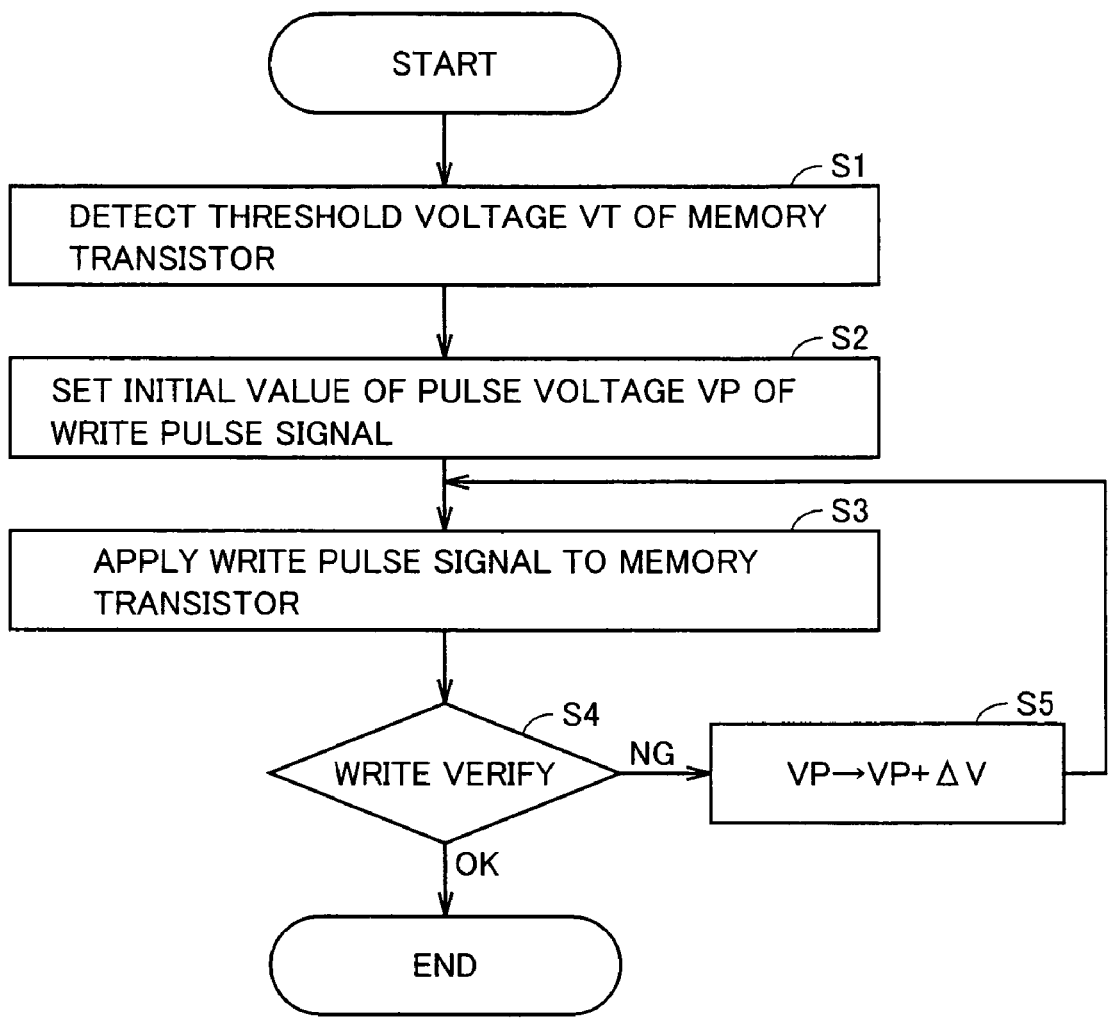
FIG. 7 is a flow chart illustrating a method employed in the FIG. 5 flash memory to write data.

The flash memory is characterized by a method of writing data, as will be described hereinafter. FIG. 7 is a flow chart illustrating a method employed in the flash memory to write data. Decoders 11 and 12 select memory transistor 1 and at step S1 the selected memory transistor 1's threshold VT is detected by means of verify control circuit 21, verify voltage generation circuit 22, sense amplifier 15 and the like.

Figure 8:
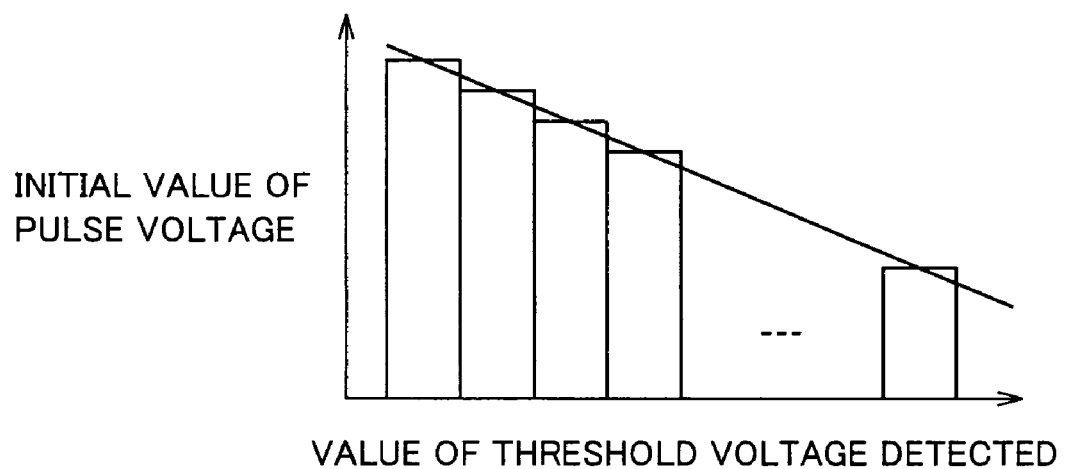
FIG. 8 represents a relationship between a detected value of a threshold voltage of a memory transistor and an initial value of a pulse voltage.

At step S2, the resultant detection of threshold voltage VT of memory transistor 1 is used to set an initial value of a pulse voltage VP of a write pulse signal by verify control circuit 21. As shown in FIG. 8, if threshold voltage VT detected has a small value, pulse voltage VP's initial value is set relatively high and if threshold voltage VT detected has a large value, pulse voltage VP's initial value is set relatively low. This is because if threshold voltage VT is low, a relatively large pulse voltage VP is applied to rapidly increase threshold voltage VT and if threshold voltage VT is high, then a relatively small pulse voltage VP is applied to minimize a current of memory transistor 1. The pulse voltage VP initial value is set at a prescribed voltage (for example of 4V) between a threshold voltage (of at most 1V) of memory transistor having "1" stored therein and a threshold voltage (of at least 5V) of memory transistor 1 having "0" stored therein.

Figure 9:
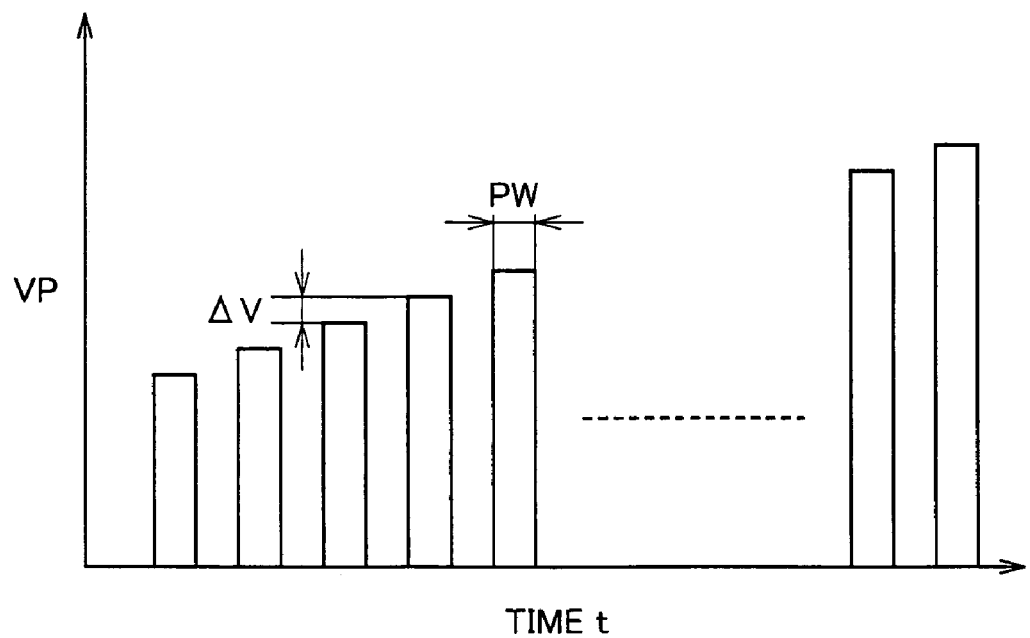
FIG. 9 is a waveform diagram representing a write pulse signal train.

At step S3, memory transistor 1 receives a write pulse signal at control gate 3. FIG. 9 is a waveform diagram representing a write pulse signal train. The write pulse signal has a pulse width PW set at a fixed value between 10 μs and 20 μs. As shown in FIG. 3, memory transistor 1 receives 5V at drain 5 and 0V at source 4 and well W. The write pulse signal is applied by command decoder 20, program voltage generation circuit 23, decoders 11 and 12,. Y gate 14 and the like.

Figure 10A:
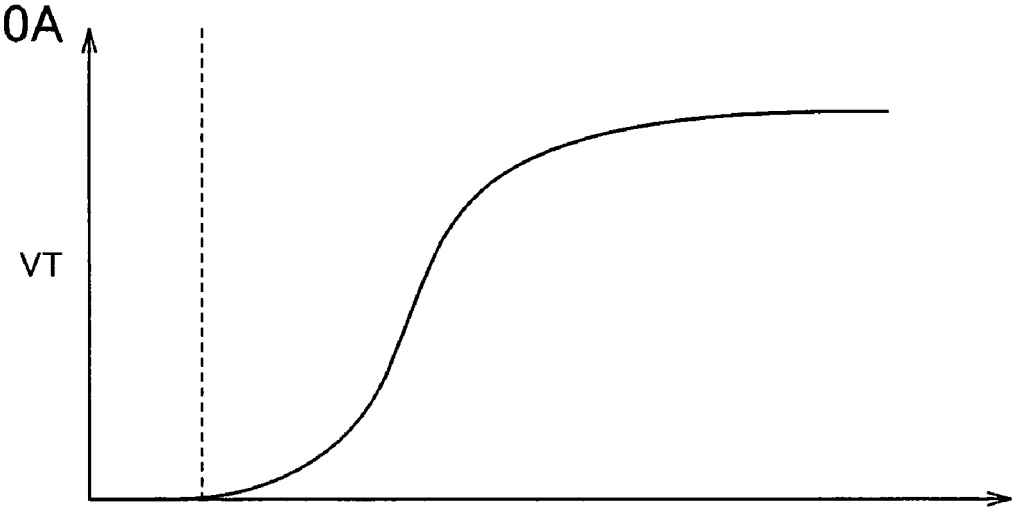
FIGS. 10A, 10B and 10C are waveform diagrams representing how the memory transistor's threshold voltage VT and drain current ID and pulse voltage VP vary with time.
Figure 10B:
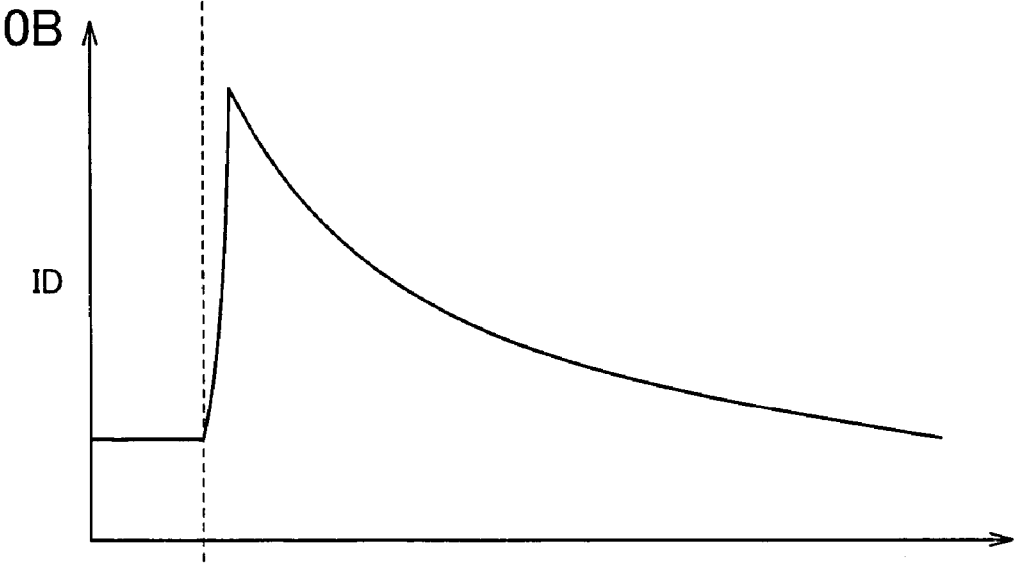
Figure 10C:
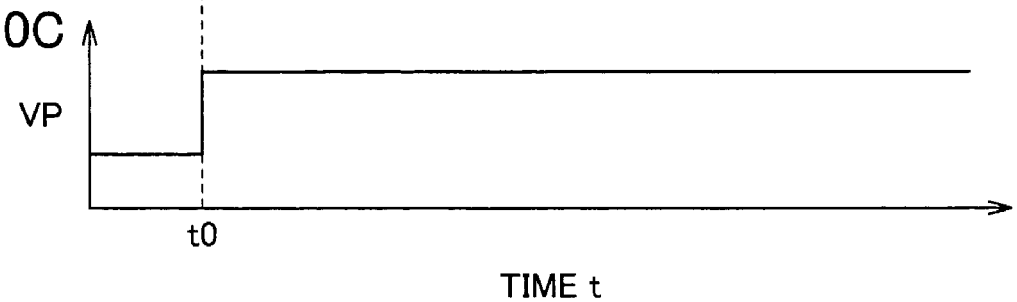

FIGS. 10A, 10B and 10C are waveform diagrams representing a variation in threshold voltage VT and current ID with time. At time t0, pulse voltage VP is applied. In response, the memory transistor 1 drain current ID-rapidly increases and reaches a peak value and thereafter gradually decreases. The memory transistor 1 threshold voltage VT gradually increases in response to pulse voltage VP being applied, and saturates at a fixed value.

Again with reference to FIG. 7, at step S4, write verification is effected. More specifically, memory transistor 1 receives 1V at drain 5, source 4 and well W are set to 0V and memory transistor 1 receives at control gate 3 a voltage (for example of 4.5V) slightly lower than a threshold voltage (5V) as targeted, and whether prescribed current IC flows is detected. Write verify operation is performed by verify control circuit 21, verify voltage generation circuit 22, decoders 11 and 12, sense amplifier 15, and the like. If prescribed current IC does not flow a decision is made that memory transistor 1 has threshold voltage VT sufficiently increased and write operation is completed. If prescribed current IC flows, a decision is made that memory transistor 1 has threshold voltage VT still low and step S5 is performed.

At step S5, verify control circuit 21 sets the write pulse signal's pulse voltage VP at a value higher by a step voltage $\Delta V$, as shown in FIG. 9. Step voltage $\Delta V$ is a fixed voltage between 0.1V to 0.2V. Thereafter, steps S3–S5 are repeated until memory transistor 1 has threshold voltage VT having reached a targeted value.

Figure 11:
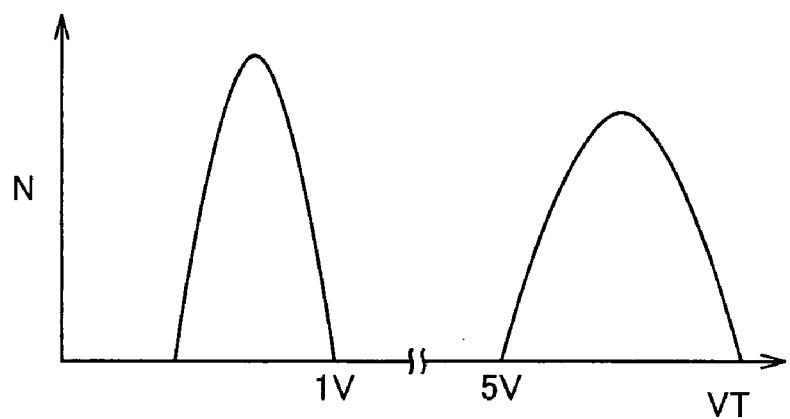
FIG. 11 illustrates a distribution of the threshold voltage of the memory transistor.

FIG. 11 shows a distribution of threshold voltage VT of a plurality of memory transistors 1 in memory cell array 13. In FIG. 11, the horizontal axis represents threshold voltage VT of memory transistor 1 and the vertical axis represents the number N of memory transistors 1. By performing a write operation, threshold voltage VT is increased from 1V or less to 5V or more.

Figure 12:
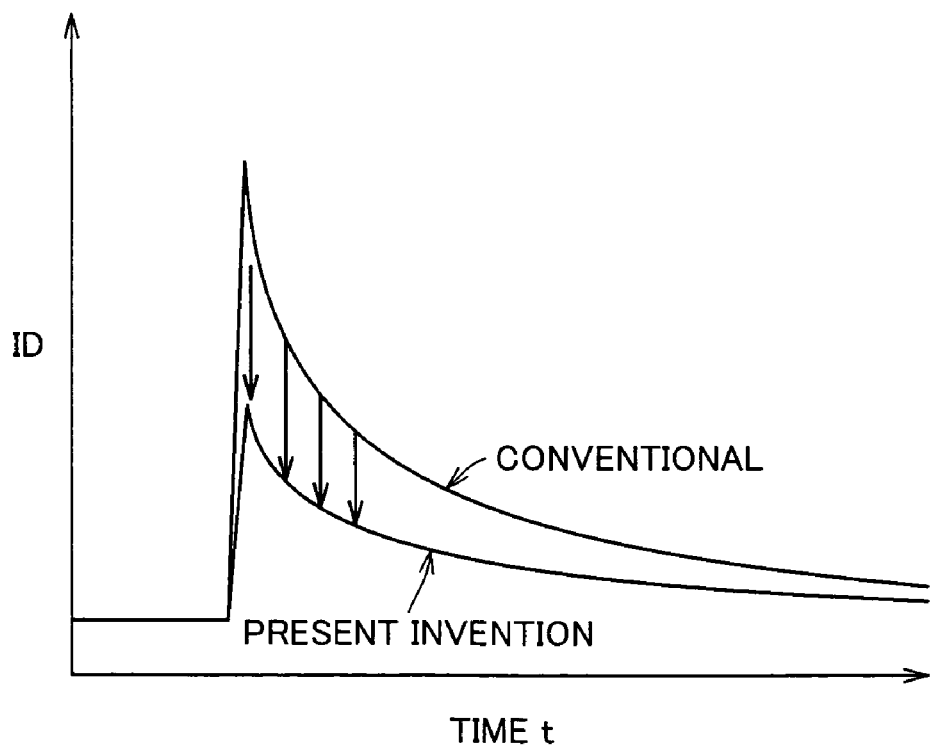
FIG. 12 is a diagram for illustrating an effect of the first embodiment.
Figure 13:
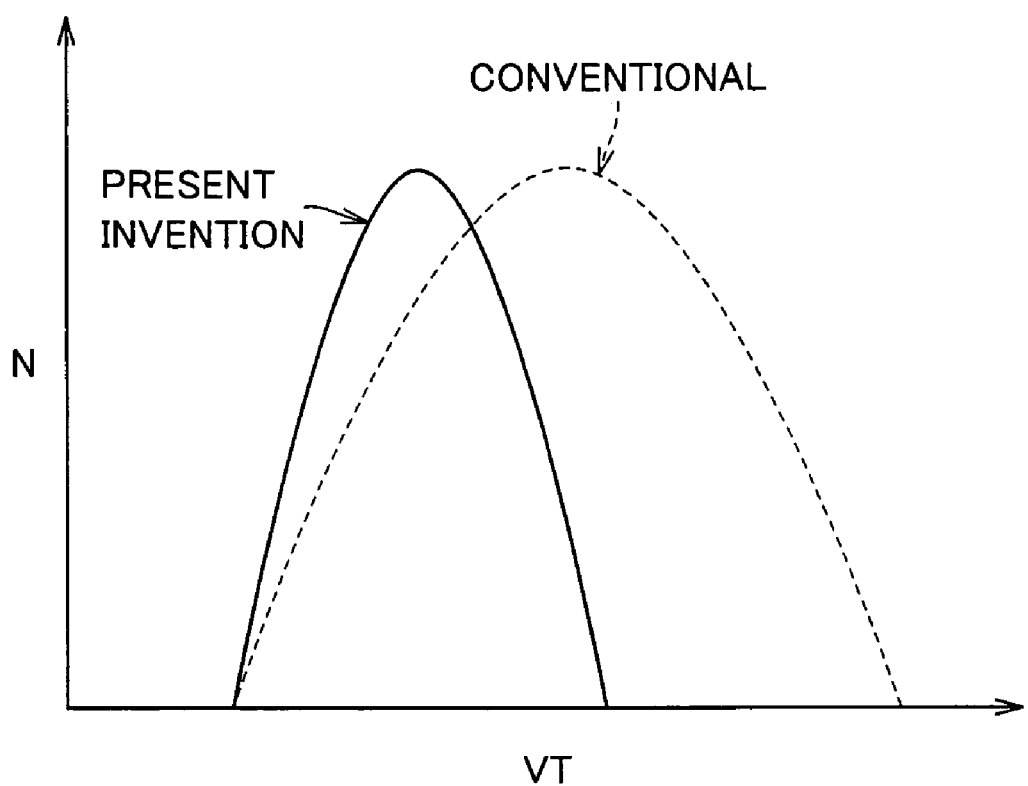
FIG. 13 is another diagram for illustrating an effect of the first embodiment.

In the first embodiment the memory transistor 1 threshold voltage VT is detected and if the voltage detected has a smaller value, the write pulse signal's pulse voltage VP initial value is set low. A smaller drain current ID of memory transistor 1 and a smaller current consumption can be achieved, as shown in FIG. 12, than when a fixed pulse voltage is applied regardless of threshold voltage VT of memory transistor 1, as conventional. Furthermore, whenever the write pulse signal is applied, pulse voltage VP can be increased by step voltage $\Delta V$, and threshold voltage VT is not excessively increased, as conventional. As such, threshold voltage VT can have a distribution smaller in width than conventional, as shown in FIG. 13.

In each of read, write, erase and verify operations the memory transistor 1 control gate 3, source 4, drain 5 and well W may have applied thereto a voltage having a value other than the above values as they are set by way of example.

Second Embodiment

Figure 14:
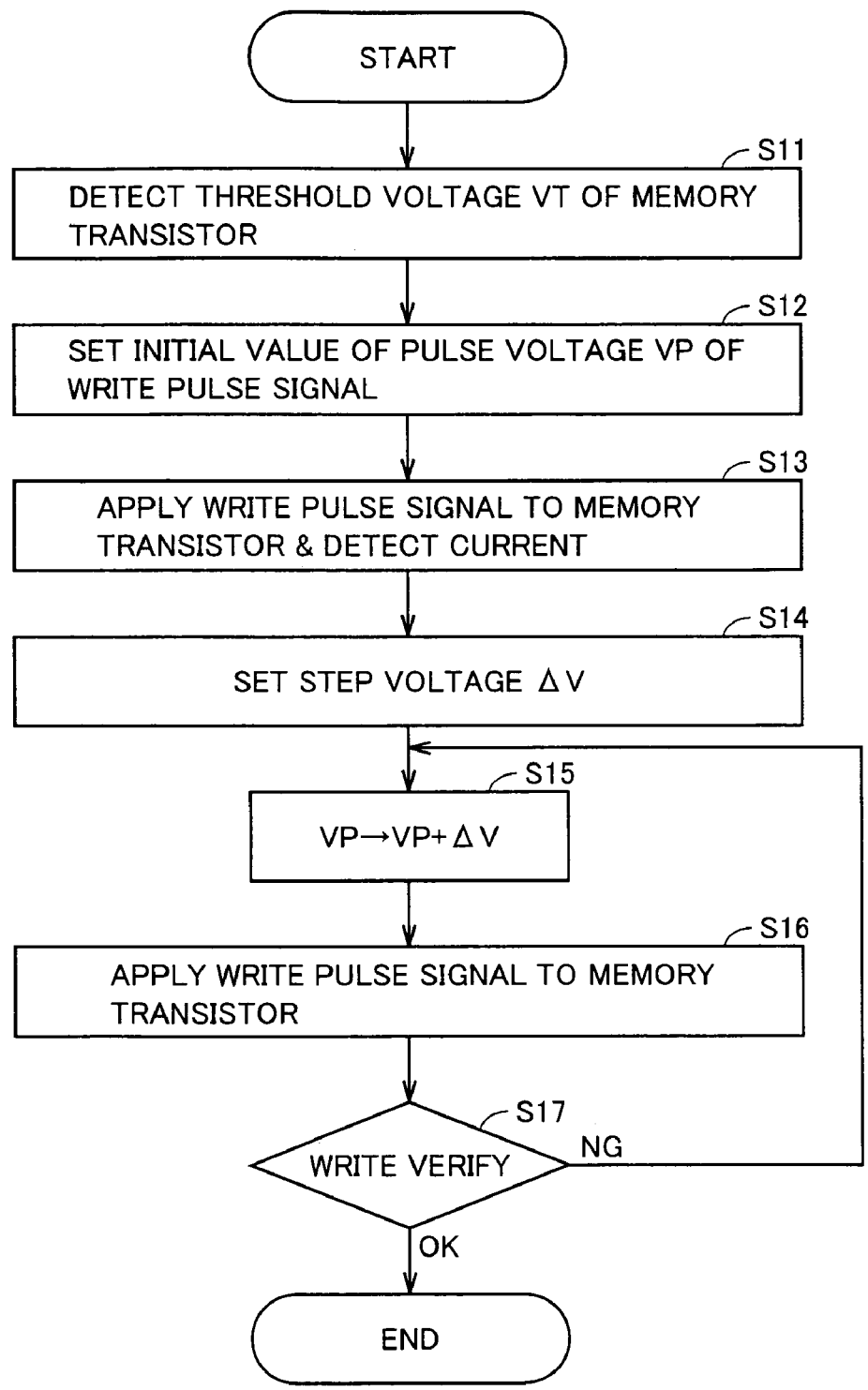
FIG. 14 is a flow chart illustrating a method employed for a flash memory to write data in accordance with a second embodiment of the present invention.

FIG. 14 is a flow chart illustrating a method employed in the present flash memory to write data in a second embodiment. With reference to FIG. 14 at step S11 threshold voltage VT of a selected memory transistor 1 is detected and at step S12 the threshold voltage VT value detected is used to set an initial value of pulse voltage VP of a write pulse signal. This process is identical to that described in the first embodiment.

Figure 15:
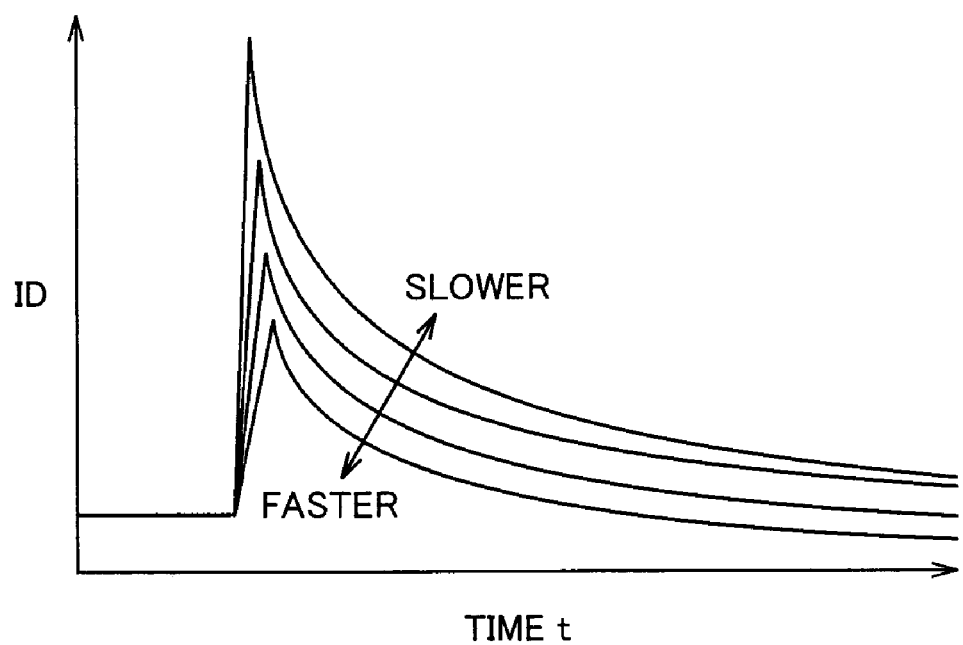
FIG. 15 represents a relationship between a rate at which the memory transistor's threshold voltage varies and a drain current.
Figure 16:
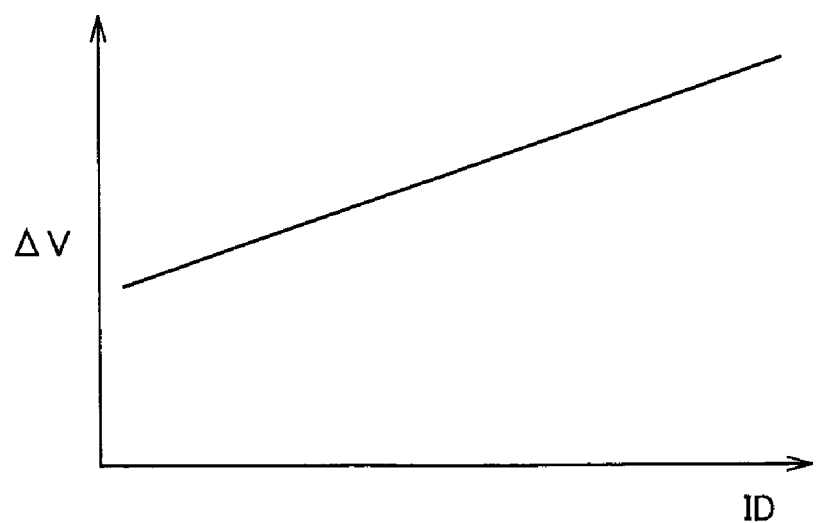
FIG. 16 represents a relationship between the memory transistor's drain current and a step voltage.

Then at step S13 memory transistor 1 receives the write pulse signal and sense amplifier 15 detects the memory transistor 1 drain current ID and at step S14 verify control circuit 21 is driven by the drain current ID value detected to set step voltage $\Delta V$. As shown in FIG. 15, the memory transistor 1 drain current ID is smaller for threshold voltage VT changing faster and is larger for threshold voltage VT changing slower. Accordingly, as shown in FIG. 16, when drain current ID is small, threshold voltage VT readily varies, and step voltage $\Delta V$ is accordingly set to have a small value, and when drain current ID is large, threshold voltage VT less readily varies, and step voltage $\Delta V$ is accordingly set to have a large value.

Then at step S15 the write pulse signal's pulse voltage VP is increased by step voltage $\Delta V$ and at step S16 the write pulse signal is applied to memory transistor 1. At step S17, write verify 17 is effected, and steps S15–S17 are repeated until memory transistor 1 has threshold voltage VT higher than a target voltage. The remainder of the configuration and operation is identical to that of the first embodiment.

In the second embodiment, as well as the first embodiment, an initial value of pulse voltage VP of a write pulse signal is set, and thereafter the write pulse signal is applied to memory transistor 1 and drain current ID is detected, and the detected value is used to set step voltage $\Delta V$. Step voltage $\Delta V$ is adjusted in accordance with a rate at which the memory transistor 1 threshold voltage VT varies, and threshold voltage VT can have a distribution smaller in width than in the first embodiment.

Figure 17:
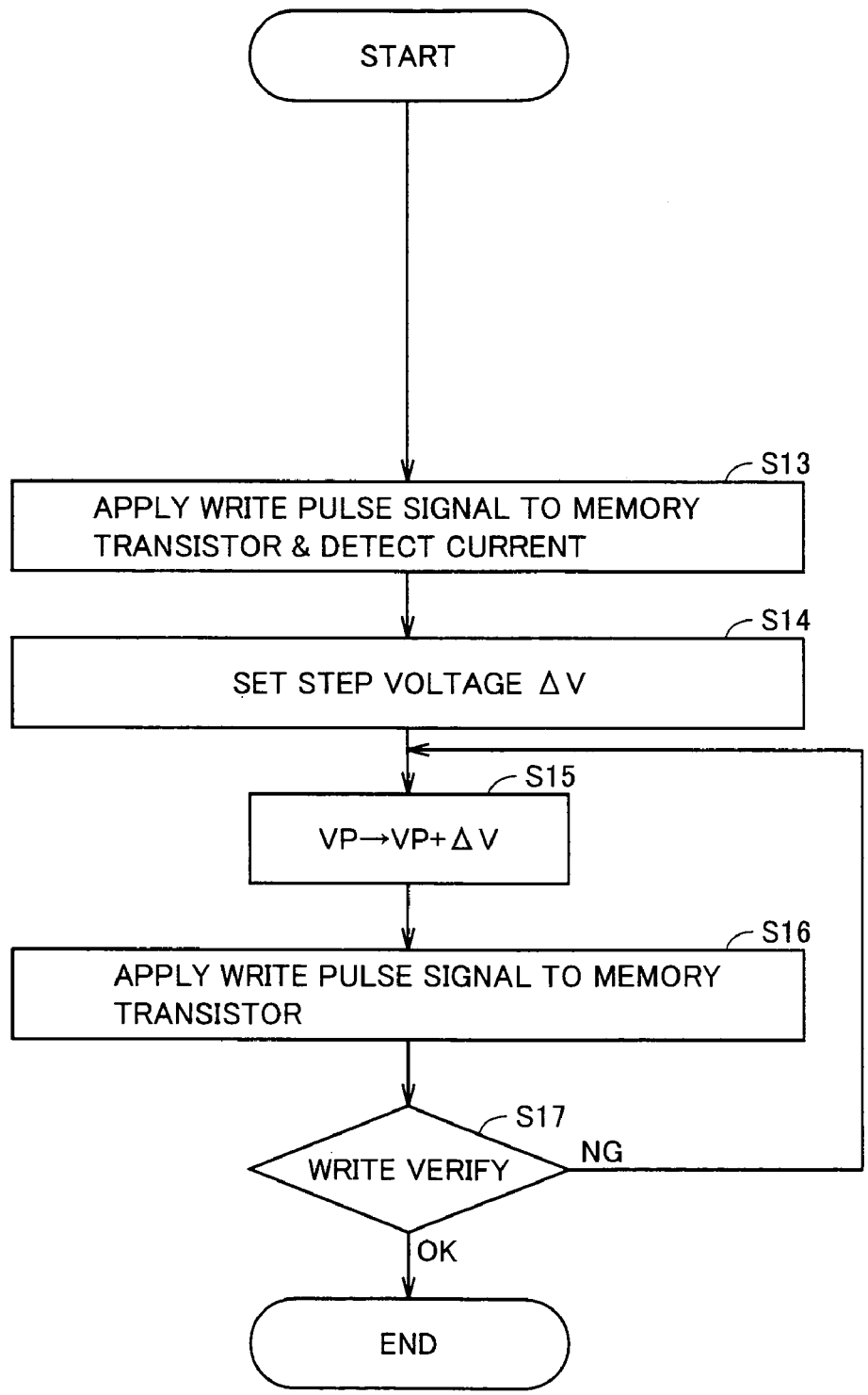
FIG. 17 is a flow chart illustrating an exemplary variation of the second embodiment.

FIG. 17 is a flow chart illustrating an exemplary variation of the second embodiment, as compared with FIG. 14. With reference to FIG. 17, in the exemplary variation, a write pulse signal has pulse voltage VP fixed at a value (for example of 4V) and steps S11 and S12 are not performed. The exemplary variation thus allows a write time shorter by steps S11 and S12.

Third Embodiment

Figure 18:
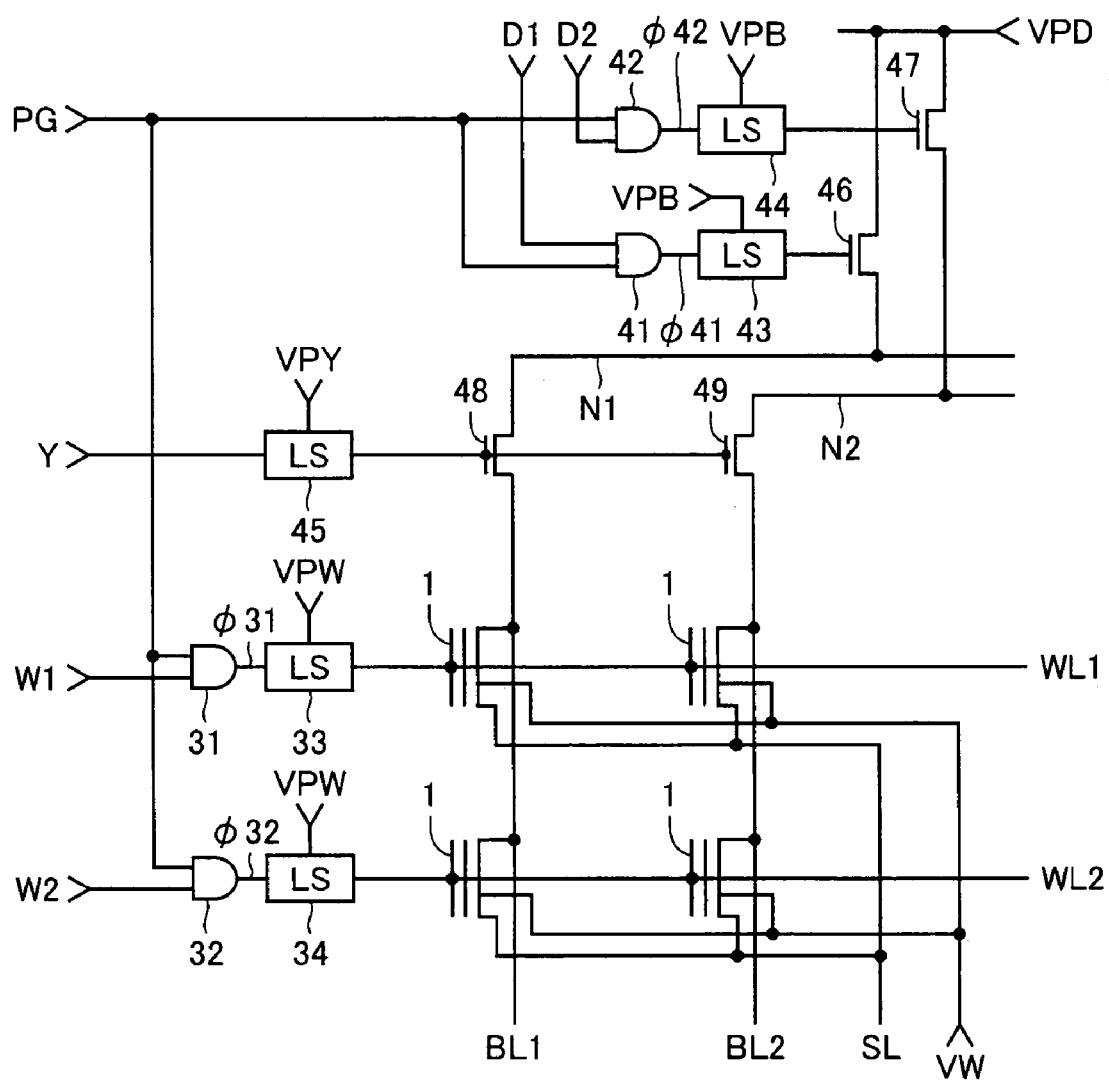
FIG. 18 is a circuit block diagram showing a main portion of the present flash memory in a third embodiment.

FIG. 18 is a circuit block diagram showing a main portion of the present flash memory in a third embodiment. FIG. 18 shows a portion associated with two data signals D1 and D2. In reality, a large number of columns are provided for a single data signal and a large number of memory transistors 1 are provided for a single column. To simplify the drawing and description, however, FIG. 18 shows a single column is shown for a single data signal and two memory transistors 1 are shown for a single column.

Two rows of memory transistors 1 are associated with word lines WL1 and WL2, respectively, and two columns of memory transistors 1 are associated with bit lines BL1 and BL2, respectively, and the four memory transistors 1 share source line SL. Memory transistor 1 has a control gate connected to the corresponding word line WL, a drain to the corresponding bit line BL, a source to the corresponding source line SL, and a back gate (well W) receiving a well voltage VW.

Word line WL is associated with an AND gate 31 and a level shifter (LS) 33 and word line WL2 is associated with an AND gate 32 and a level shifter 34. AND gate 31 receives signals PG and W1 and AND gate 32 receives signals PG and W2. Signal PG is set high in response to a write command signal for a prescribed period of time. Signals W1 and W2 are set high when row address signal RA designates word lines WL1 and WL2, respectively.

Level shifter 33 operates in response to AND gate 31 outputting a signal $\phi 31$ of the low level to set word line WL1 low and operates in response to AND gate 31 outputting signal $\phi 31$ of the high level to set word line WL1 to a prescribed potential VPW. Level shifter 34 operates in response to AND gate 32 outputting a signal $\phi 32$ of the low level to set word line WL2 low and operates in response to AND gate 32 outputting signal $\phi 32$ of the high level to set word line WL2 to the prescribed potential VPW. Potential VPW is a potential increased stepwise. Potential VPW will be described later.

Bit lines BL1 and BL2 are associated with n channel MOS transistors 48 and 49, respectively, and n channel MOS transistors 48 and 49 share a level shifter 45. N channel MOS transistor 48 is connected between a node N1 and bit line BL1 and n channel MOS transistor 49 is connected between a node N2 and bit line BL2. Level shifter 45 operates in response to a signal Y of the low level to set the n channel MOS transistors 48 and 49 gates low and operates in response to signal Y of the high level to set the n channel MOS transistors 48 and 49 gates to a prescribed potential VPY. Signal Y is set high when column address signal CA designates a corresponding column. When signal Y is set high, n channel MOS transistors 48 and 49 conduct.

Furthermore, bit line BL1 is associated with an AND gate 41, a level shifter 43 and an n channel MOS transistor 46, and bit line BL2 is associated with an AND gate 42, a level shifter 44 and an n channel MOS transistor 47. N channel MOS transistors 46 and 47 have their respective drains both receiving a potential VPD and their respective sources connected to nodes N1 and N2, respectively. AND gate 41 receives signal PG and data signal T1 and AND gate 42 receives signal PG and data signal D2.

Level shifter 43 operates in response to AND gate 41 outputting a signal φ41 of the low level to set the n channel MOS transistor 46 gate low and operates in response to AND gate 41 outputting signal φ41 of the high level to set the n channel MOS transistor 46 gate to a prescribed potential VPB. Level shifter 44 operates in response to AND gate 42 outputting a signal φ42 of the low level to set the n channel MOS transistor 47 gate low and operates in response to AND gate 42 outputting signal φ42 of the high level to set the n channel MOS transistor 47 gate to the prescribed potential VPB. When signals PG and D1 are both set high n channel MOS transistor 46 conducts and when signals PG and D2 are both set high n channel MOS transistor 47 conducts.

The FIG. 18 flash memory's write operation will now be described. Initially in response to row address signal RA one of signals W1 and W2 is raised to the high level of a selected level and in response to column address signal CA signal Y is raised to the high level of the selected level. When signal Y is set high n channel MOS transistors 48 and 49 conduct. Furthermore, data signals D1 and D2 are each set high (0) or low (1). In this scenario, signal W1 is pulled high and data signals D1 and D2 are set high and low, respectively, for the sake of illustration. Then when signal PG is pulled high, AND gate 31 outputs signal φ31 set high and word line WL1 receives VPW, and AND gate 41 outputs signal φ41 set high and bit line BL1 receives VPD, and data is written to memory transistor 1 located at the intersection of word line WL1 and bit line BL1.

Figure 19A:
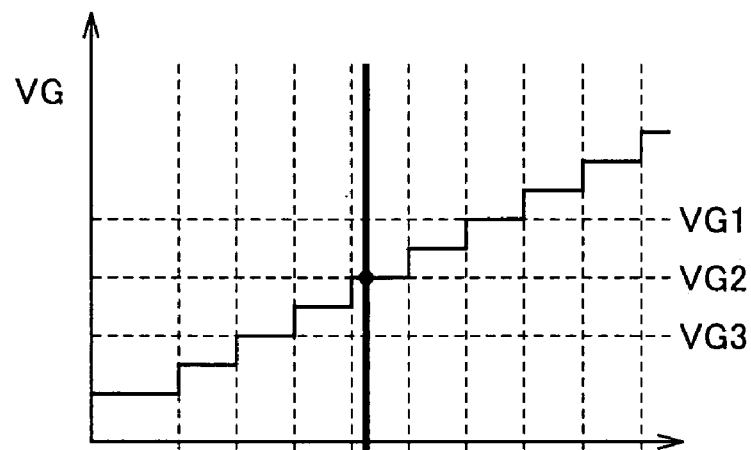
FIGS. 19A, 19B, 19C illustrate a principle of a method employed in the FIG. 18 flash memory to write data.
Figure 19B:
Figure 19C:
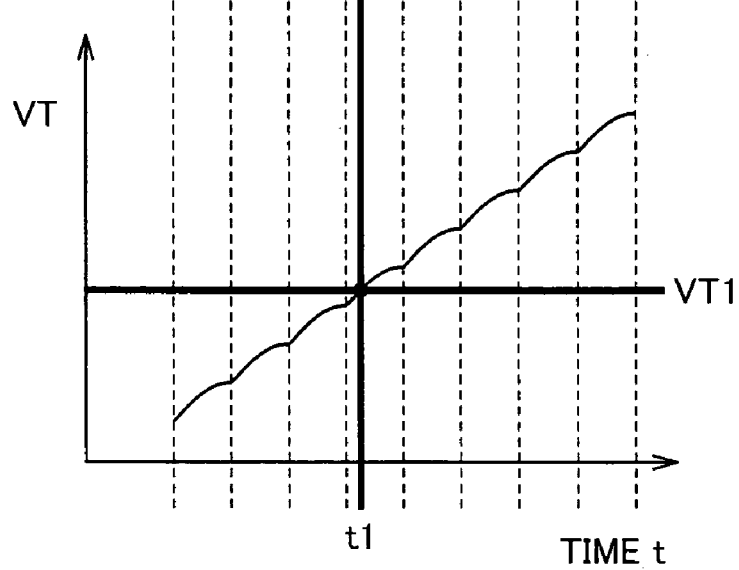

FIGS. 19A–19C are timing plots for illustrating how the memory transistor 1 control gate potential VG, drain current ID and threshold voltage VT vary in writing data. Control gate potential VG is increased for every prescribed period of time by a prescribed voltage stepwise. When VG rises, drain current ID also increases. However, ID falls within a fixed range since the VG's waveform is so set. By gradually increasing VG as described above, drain ID is limited to have a small peak value.

As control gate potential VG is thus controlled, memory transistor 1 has threshold voltage VT shifting substantially linearly. When control gate potential VG attains a prescribed potential (for example of VG2) and drain current ID attains a prescribed current (for example of ID2) (i.e., at time t1) and control gate potential VG is also interrupted, the memory transistor 1 threshold voltage VT attains a prescribed value VT1 determined by VG2 and ID2.

Figure 20:
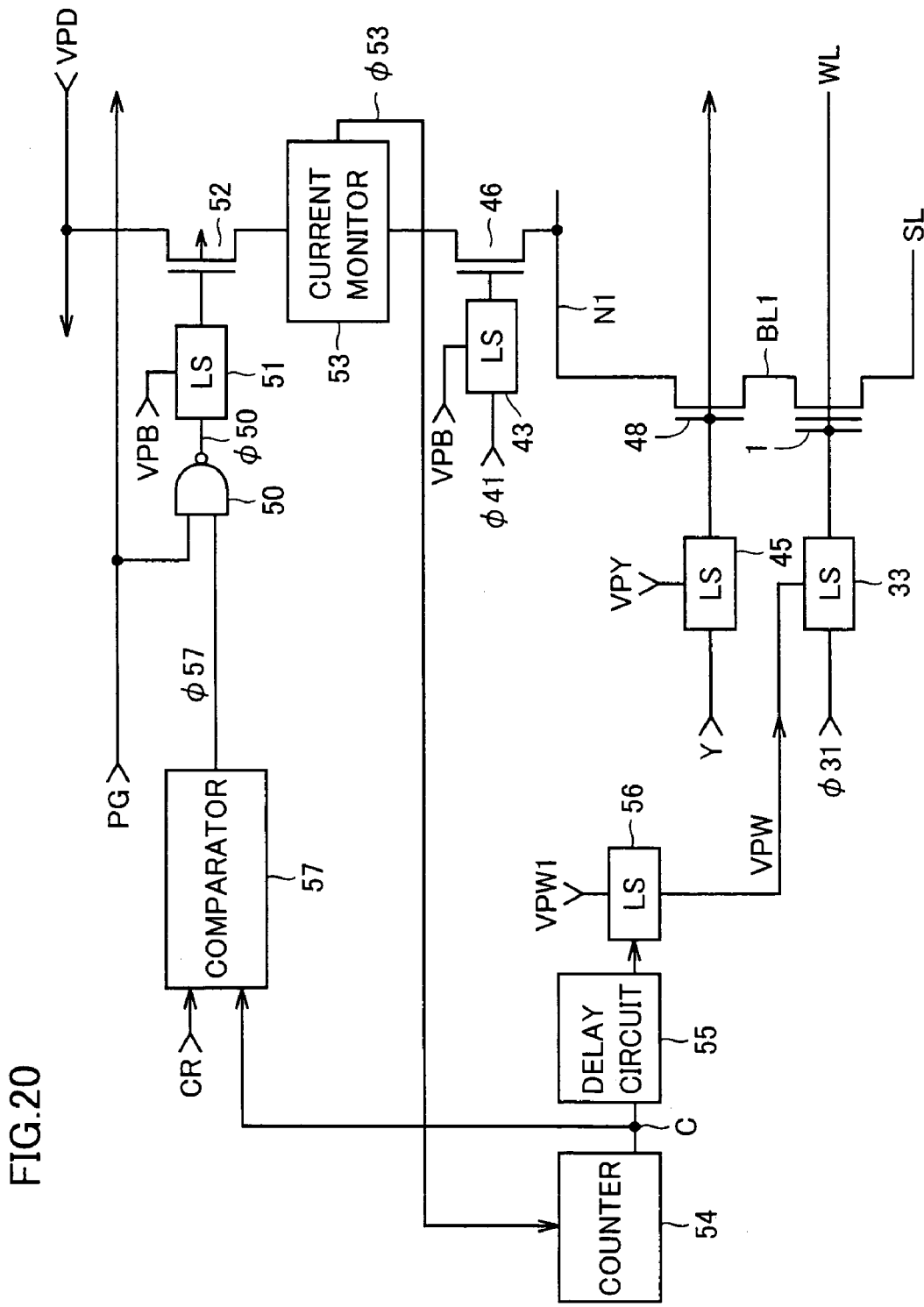
FIG. 20 is a circuit block diagram showing a configuration employed to implement the FIGS. 19A, 19B, 19C method.

FIG. 20 is a circuit block diagram showing a means implementing the write operation represented in FIGS. 19A–19C. As shown in FIG. 20, this flash memory has the FIG. 18 configuration plus an NAND gate 50, level shifters 51 and 56, a p channel MOS transistor 52, a current monitor 53, a counter 54, a delay circuit 55 and a comparator 57.

NAND gate 50 receives signal PG and a signal φ57 output from comparator 57. Level shifter 51 operates in response to NAND gate 50 outputting a signal φ50 of the low level to set the p channel MOS transistor 52 gate low and operates in response to NAND gate 50 outputting signal φ50 of the high level to set the p channel MOS transistor 51 gate to the prescribed potential VPB. P channel MOS transistor 52 has a source receiving potential VPD and a drain connected via current monitor 53 to n channel MOS transistors 46, 47 at drain.

If memory transistor 1 located at the intersection of word line WL1 and bit line BL1 has been selected for the sake of illustration, then when signals PG and φ57 are both set high, p channel MOS transistor 52 conducts and a current flows from the VPD line through p channel MOS transistor 52, current monitor 53, n channel MOS transistor 46, 48 and memory transistor 1 to source line SL. Current monitor 53 outputs a signal φ53 set high for the memory transistor 1 drain current ID smaller than a reference current IR and set low for the memory transistor 1 drain current ID larger than reference current IR.

A counter 54 counts the number of rising edges of signal φ53 output from current monitor 53. Counter 54 thus provides a count value C incremented by one whenever signal φ53 is pulled from low to high. Delay circuit 55 delays count value C by a prescribed period of time T1 for application to level shifter 56. Level shifter 56 is driven by a potential VPW1 and operates in response to the delayed count value C being incremented to increase potential VPW by step voltage ΔV. Comparator 57 compares the counter 50 count value C with a reference count value CR and if count value C is smaller than reference count value CR comparator 57 sets signal φ56 high and if count value C has reached reference count value CR comparator 57 sets signal φ56 low.

Figure 21:
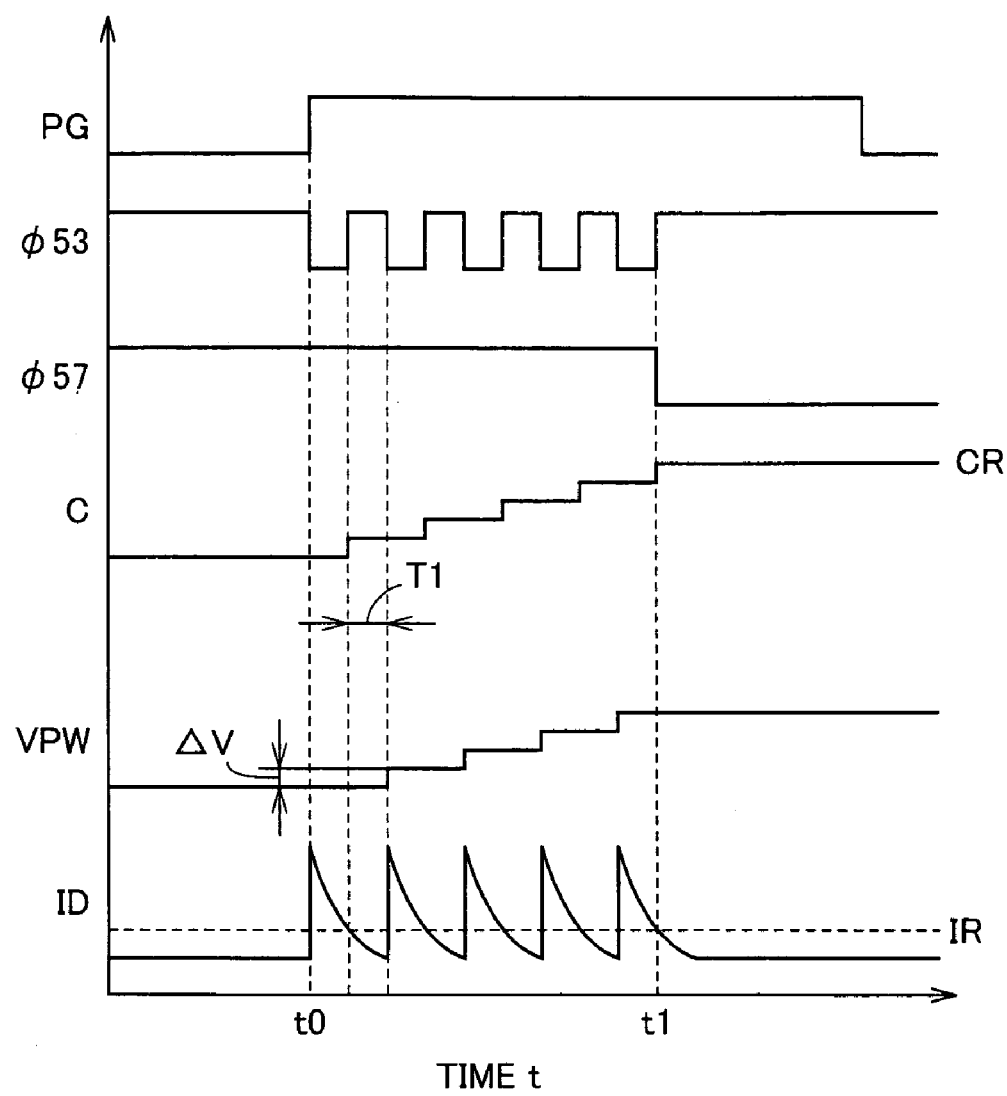
FIG. 21 is timing plots for illustrating the FIG. 20 circuit's operation.

FIG. 21 is timing plots for illustrating the FIG. 20 flash memory in operation. At time t0, signal PG is pulled high. In response, NAND gate 50 outputs signal φ50 set low and p channel MOS transistor 52 conducts, the memory transistor 1 drain current ID rapidly increases, and current monitor 53 outputs signal φ53 pulled from high to low.

When drain current ID attains a peak value and then decreases to be lower than reference current IR, current monitor 53 outputs signal φ53 pulled from low to high and the counter 54 count value C increments. Thereafter when a prescribed period of time T1 elapses level shifter 56 outputs potential VPW having a level set higher by step voltage ΔV.

When level shifter 56 outputs potential VPW having a level set higher by step voltage ΔV, the memory transistor 1 drain current ID again increases. Thereafter, this cycle is repeated. When the counter 50 count value C attains reference count value CR (or at time t1) comparator 57 outputs signal φ57 pulled from high to low and p channel MOS transistor 52 does not conduct and the write ends.

In the third embodiment the memory transistor 1 control gate potential VG is increased by step voltage ΔV stepwise and the memory transistor 1 drain current ID is detected and when VG attains a reference potential and drain current ID also attains a reference current, drain current ID is responsively interrupted. A smaller peak value of drain current ID and a smaller current consumption can be achieved than when a fixed potential is applied to memory transistor 1 at a control gate, as conventional. Furthermore, memory transistor 1 can be prevented from having threshold voltage VT excessively increased. A reduced variation in threshold voltage VT can thus be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
   a memory transistor having over a semiconductor substrate's well region a floating gate and a control gate deposited on said floating gate, said memory transistor having a threshold voltage set to a first voltage to store a data signal of a first logic level, said memory transistor having said threshold voltage set to a second voltage higher than said first voltage to store a data signal of a second logic level;
   a first detection circuit detecting said memory transistor's threshold voltage;
   a write circuit applying a prescribed voltage to said memory transistor between a drain and a source and applying a pulse signal train between said control gate and said well region, and increasing said memory transistor's threshold voltage from said first voltage to said second voltage; and
   a control circuit driven by a resultant detection provided by said first detection circuit to set an initial value of an amplitude voltage of said pulse signal train and increase said pulse signal train's amplitude voltage at a prescribed rate.

2. The non-volatile semiconductor memory device of claim 1, further comprising a second detection circuit detecting a value of a current of said memory transistor, wherein said control circuit is driven by a resultant detection provided by said second detection circuit to set a rate applied to increase said pulse signal train's amplitude voltage.

3. The non-volatile semiconductor memory device of claim 1, wherein said pulse signal train's amplitude voltage has said initial value set to have a value between said first and second voltages.

4. A non-volatile semiconductor memory device comprising:
   a memory transistor having over a semiconductor substrate's well region a floating gate and a control gate deposited on said floating gate, said memory transistor having a threshold voltage set to a first voltage to store a data signal of a first logic level, said memory transistor having said threshold voltage set to a second voltage higher than said first voltage to store a data signal of a second logic level;
   a write circuit applying a prescribed voltage to said memory transistor between a drain and a source and applying a pulse signal train between said control gate and said well region, and increasing said memory transistor's threshold voltage from said first voltage to said second voltage;
   a detection circuit detecting a value of a current of said memory transistor; and
   a control circuit setting an initial value of said pulse signal train to a predetermined value and driven by a resultant detection provided by said detection circuit to set a rate applied to increase said pulse signal train's amplitude voltage, and employing said rate to increase said pulse signal train's amplitude voltage.

5. The non-volatile semiconductor memory device of claim 4, wherein said pulse signal train's amplitude voltage has said initial value set to have a value between said first and second voltages.

6. A non-volatile semiconductor memory device comprising:
   a memory transistor having over a semiconductor substrate's well region a floating gate and a control gate deposited on said floating gate, said memory transistor having a threshold voltage set to a first voltage to store a data signal of a first logic level, said memory transistor having said threshold voltage set to a second voltage higher than said first voltage to store a data signal of a second logic level;
   a write circuit applying a third voltage to said memory transistor between a drain and a source thereof and applying a fourth voltage between said control gate and said well region, and increasing said memory transistor's threshold voltage from said first to second voltages to write a data signal to said memory transistor;
   a detection circuit detecting a value of a current of said memory transistor; and
   a control circuit increasing said fourth voltage by a predetermined voltage stepwise and operative in response to said fourth voltage having reached a reference voltage and said detection circuit detecting said memory transistor's current value having reached a reference current to stop writing a data signal to said memory transistor.

7. The non-volatile semiconductor memory device of claim 6, wherein:
   said detection circuit sets a detection signal to a first level for said memory transistor's current value smaller than said reference current and sets said detection signal to a second level for said memory transistor's current value larger than said reference current; and
   said control circuit includes
   a counter counting how many times said detection signal transitions from said second to first levels,
   a voltage generation circuit operative in response to said counter's count value being incremented to increase said fourth voltage by said predetermined voltage, and
   a comparator operative in response to said counter's count value having reached a predetermined value to stop applying said third voltage between said memory transistor's drain and source.

* * * * *